(12) United States Patent
Fujita et al.

(10) Patent No.: US 6,567,330 B2
(45) Date of Patent: May 20, 2003

(54) SEMICONDUCTOR MEMORY DEVICE (75) Inventors: Katsuyuki Fujita, Yokohama (JP); Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/102,981

(22) Filed: Mar. 22, 2002

(65) Prior Publication Data

US 2003/0035324 A1 Feb. 20, 2003

(30) Foreign Application Priority Data

Aug. 17, 2001 (JP) ........................... 2001-248122

(51) Int. Cl.[7] .................. G11C 7/02; G11C 7/00
(52) U.S. Cl. .................. 365/210; 365/203; 365/207
(58) Field of Search .................. 365/185.05, 182.2, 365/185.21, 189.06, 189.07, 203, 205, 207, 208, 210

(56) References Cited

U.S. PATENT DOCUMENTS

| 5,386,388 | A | * | 1/1995 | Atwood et al. | 365/185.2 |
| 5,742,543 | A | * | 4/1998 | Fazio | 365/185.21 |
| 5,910,914 | A | * | 6/1999 | Wang | 365/185.2 |
| 6,038,169 | A | * | 3/2000 | Ogura et al. | 365/185.2 |
| 6,205,073 | B1 | | 3/2001 | Naji | 365/171 |
| 6,219,290 | B1 | * | 4/2001 | Chang et al. | 365/185.21 |
| 6,337,825 | B2 | * | 1/2002 | Tanzawa et al. | 365/185.2 |
| 6,407,946 | B2 | * | 6/2002 | Maruyama et al. | 365/185.2 |

FOREIGN PATENT DOCUMENTS

JP 03171768 7/1991

OTHER PUBLICATIONS

Leiss, et al., "dRAM Design Using the Taper–Isolated Dynamic RAM Cell", IEEE Journal of Solid–State Circuits, vol. SC–17, No. 2, Apr. 1982, pp. 337–344.
Tack, et al., "The Multistabel Charge–Controlled Memory Effect in SOI MOS Transistors at Low Temperatures", IEEE Transactions on Electron Devices, vol. 37, No. 5, May 1990, pp. 1373–1382.
Wann, et al., "A Capacitorless DRAM Cell on SOI Substrate", IEDM 1993, pp. 635–638.

* cited by examiner

Primary Examiner—Trong Phan
(74) Attorney, Agent, or Firm—Banner & Witcoff, LTD.

(57) ABSTRACT

A semiconductor memory device has a memory cell array including memory cells; a reference current generating circuit which generates a reference current; a reference voltage generating circuit which generates a reference voltage in a reference node on the basis of the reference current generated by the reference current generating circuit; a first sense circuit which generates an output current on the basis of a cell current of the selected memory cell and which generates a data potential in a sense node on the basis of the output current and the reference current; and a second sense circuit which detects the data held in the selected memory cell by comparing the data potential in the sense node with the reference voltage in the reference node.

22 Claims, 8 Drawing Sheets

SEMICONDUCTOR MEMORY DEVICE

CROSS REFERENCE TO RELATED APPLICATION

This application claims benefit of priority under 35 U.S.C. §119 to Japanese Patent Application No. 2001-248122, filed on Aug. 17, 2001, the entire contents of which are incorporated by reference herein.

BACKGROUND OF THE INVENTION

1. Field of the Invention

The present invention relates to a semiconductor memory device with a current-read-type memory cell, in which data is judged on the basis of the presence or absence of a cell current or the amount of the cell current. More specifically, the present invention relates to a data sense circuit for the semiconductor memory device.

2. Related Background Art

In a related DRAM, a memory cell is composed of an MOS transistor and a capacitor. The scale-down of the DRAM has been remarkably advanced by the adoption of a trench capacitor structure and a stacked capacitor structure. At present, the cell size of a unit memory cell is scaled down to an area of 2 F×4 F=8 $F^2$, where F is a minimum feature size. However, it becomes difficult to secure the same downsizing trend of cell size as before. Because, there are a technical difficulty that the transistor has to be a vertical type, a problem that electric interference between adjacent memory cells increases, and in addition difficulties in terms of manufacturing technology including fabrication, film formation, and the like.

On the other hand, some proposals for a DRAM in which a memory cell is composed of one transistor without using a capacitor are made as mentioned below.

(1) JOHN E. LEISS et al, "dRAM Design Using the Taper-Isolated Dynamic Cell" (IEEE JOURNAL OF SOLID-STATE CIRCUITS, VOL.SC-17, NO.2, APRIL 1982, pp337–344)
(2) Japanese Patent Laid-open Publication No. H3-171768
(3) Marnix R. Tack et al, "The Multistable Charge-Controlled Memory Effect in SOI MOS Transistors at Low Temperatures" (IEEE TRANSACTIONS ON ELECTRON DEVICES, VOL, 37, MAY, 1990, pp1373–1382)
(4) Hsing-jen Wann et al, "A Capacitorless DRAM Cell on SOI Substrate" (IEDM93, pp635–638)

A memory cell in the document (1) is composed of MOS transistors, each of which has a buried channel structure. Charge and discharge to/from a surface inversion layer is performed using a parasitic transistor formed at a taper portion of an element isolation insulating film to perform binary storage.

A memory cell in the document (2) uses MOS transistors which are well-isolated from each other and uses a threshold voltage of the MOS transistor fixed by a well potential as binary data.

A memory cell in the document (3) is composed of MOS transistors on an SOI substrate. A large negative voltage is applied from the SOI substrate side, and by utilizing accumulation of holes in an oxide film of a silicon layer and an interface, binary storage is performed by emitting and injecting these holes.

A memory cell in the document (4) is composed of MOS transistors on an SOI substrate. The MOS transistor is one in terms of structure, but here a structure, in which a reverse conduction-type layer is formed on top of the surface of a drain diffusion region, whereby a P-MOS transistor for write and an N-MOS transistor for read are substantially combined integrally, is adopted. With a substrate region of the N-MOS transistor as a floating node, binary data are stored by its potential.

However, in the document (1), the structure is complicated and the parasitic transistor is used, whereby there is a disadvantage in the controllability of its characteristic. In the document (2), the structure is simple, but it is necessary to control potential by connecting both a drain and a source of the transistor to a signal line. Moreover, the cell size is large and rewrite bit by bit is impossible because of the well isolation. In the document (3), a potential control from the SOI substrate side is needed, and hence the rewrite bit by bit is impossible, whereby there is a difficulty in controllability. In the document (4), a special transistor structure is needed, and the memory cell requires a word line, a write bit line, a read bit line, and a purge line, whereby the number of signal lines increases.

The memory cell composed of one transistor in the related art stores data on the basis of a gate threshold voltage difference cased by a potential difference of a channel body. This is basically different from the data storage system using accumulation of electrical charge in a capacitor. Therefore, in the memory cell composed of one transistor, the presence or absence of a cell current passed through the memory cell is detected, or whether the cell current is large or small is detected, in order to judge the data stored in the memory cell. That is, the memory cell composed of one transistor is a current-read-type memory cell.

SUMMARY OF THE INVENTION

According to one aspect of the present invention, a semiconductor memory device comprising:

a memory cell array which includes memory cells for holding data;

a reference current generating circuit which generates a reference current;

a reference voltage generating circuit which generates a reference voltage in a reference node on the basis of the reference current generated by the reference current generating circuit;

a first sense circuit which generates an output current on the basis of a cell current of the selected memory cell and which generates a data voltage in a sense node on the basis of the output current and the reference current; and a second sense circuit which detects the data held in the selected memory cell by comparing the data potential in the sense node with the reference voltage in the reference node.

DETAILED DESCRIPTION OF THE PREFERRED EMBODIMENTS

Some embodiments according to the present invention will be explained below with reference to the drawings.

Figure 1:
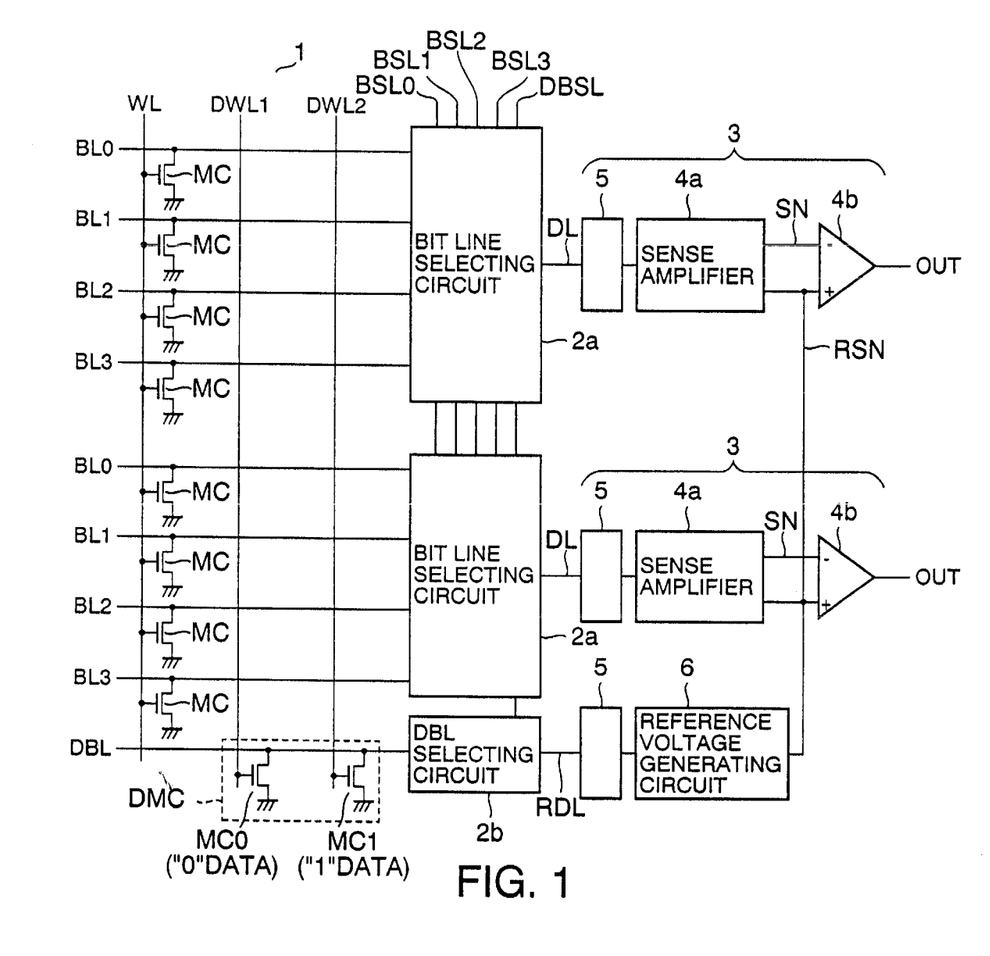
FIG. 1 is a diagram showing a constitution of a cell array and data sense circuits in a DRAM according to an embodiment of the present invention.
Figure 4:
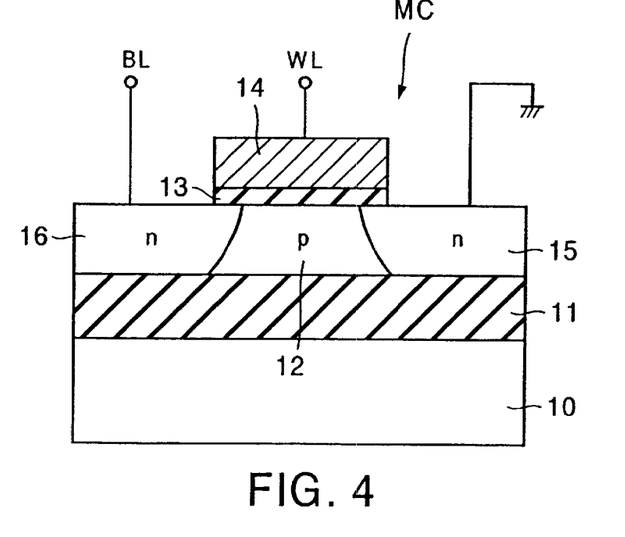
FIG. 4 is a diagram showing a structure of a DRAM cell of the embodiment.

FIG. 1 shows the constitution of a cell array 1 and data sense circuits 3 connected thereto in a DRAM of the embodiments of the present invention. A DRAM cell MC is composed of one MISFET having a channel body in a floating state. The structure of a DRAM cell MC using an n-channel MISFET is shown in FIG. 4. The DRAM cell MC has a silicon substrate 10, a p-type silicon layer 12 isolated from the silicon substrate 10 by an insulating film 11 such as a silicon oxide film, a gate electrode 14 formed with a gate insulating film 13 therebetween, and n-type diffusion regions 15 and 16, which are a source and a drain, respectively. The p-type silicon layer 12 between the n-type diffusion regions 15 and 16 serves as a channel body.

Figure 5:
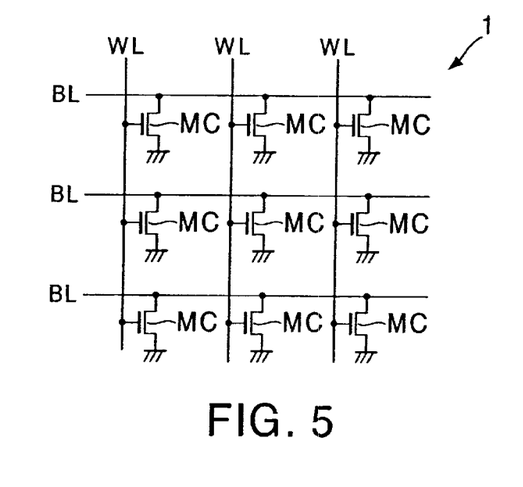
FIG. 5 is a diagram showing a structure of a cell array of the DRAM cells of the embodiment in FIG. 4.

The memory cell array 1 is structured as shown in FIG. 5. Specifically, each of the DRAM cells MC has a floating channel body isolated from one another, sources of the DRAM cells MC are set at a reference voltage (ground potential), gates of the DRAM cells aligned in one direction are connected to word lines WL, and drains of the DRAM cells aligned in a direction intersecting the word lines WL are connected to bit lines BL.

The DRAM cell MC dynamically stores a first data state in which the p-type silicon layer 12, which is the channel body, is set at a first potential and a second data state in which the p-type silicon layer 12 is set at a second potential. More specifically, the first data state is written in a manner in which high level voltages are applied to a selected word line WL and a selected bit line BL to make a selected DRAM cell perform a pentode operation and majority carriers (holes in the case of the n-channel) generated by impact ionization which occurs near the drain junction are held in the channel body. This is, for example, data "1". The second data state is written in a manner in which a high level voltage is applied to the selected word line WL to raise the channel body potential by capacitive coupling while a potential of the selected bit line BL is set at a low level, and a forward bias current is sent to the junction of the channel body and the drain of the selected DRAM cell so as to emit the majority carriers in the channel body into the drain. This is, for example, data "0".

Figure 8:
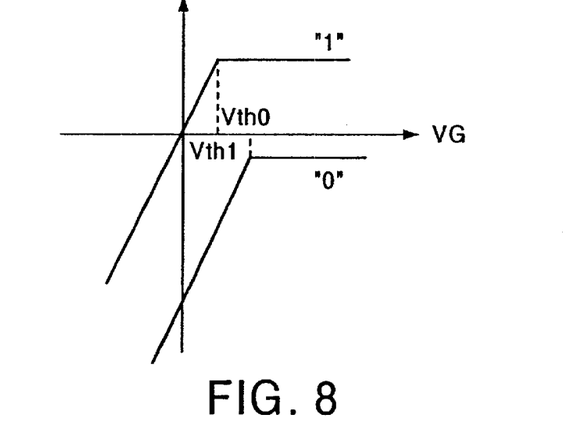
FIG. 8 is a chart showing a relation between a channel body potential and a gate potential of the DRAM cell of the embodiment.

The data "1" and "0" are represented as a difference in gate threshold of the MISFET. Specifically, the relation between the data "1" and "0", and, channel body potential VB and gate voltage VG is as shown in FIG. 8. As a result of biasing the substrate by the channel body potential, a threshold voltage Vth1 in the case of the data "1", is lower than a threshold voltage Vth0 in the case of the data "0".

Accordingly, at the time of a data read operation, the data can be judged by detecting a cell current difference caused by a threshold voltage difference.

Figure 6:
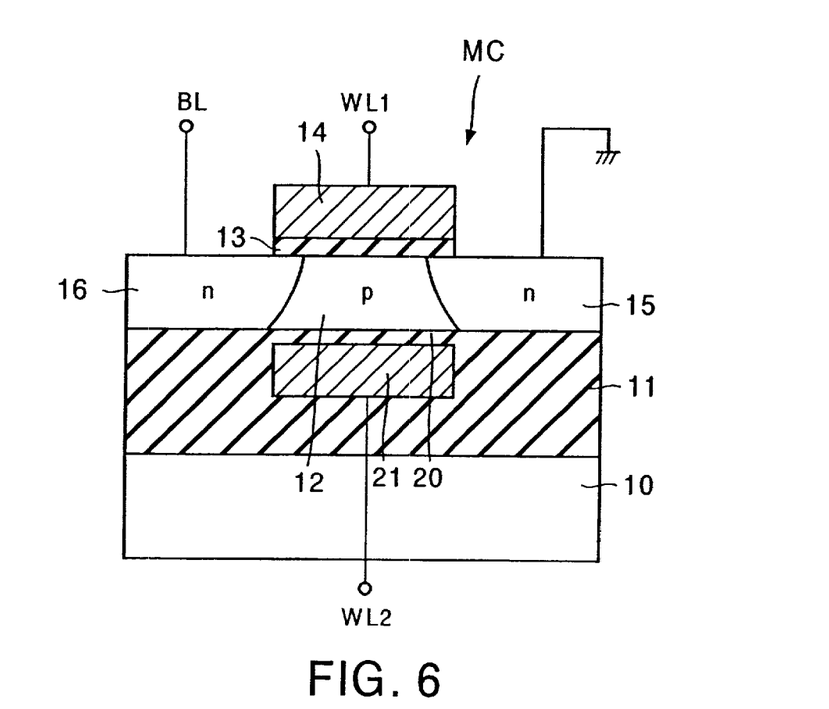
FIG. 6 is a diagram showing a structure of another DRAM cell of the embodiment.

With respect to the DRAM cell structure in FIG. 4, a modified cell structure is shown in FIG. 6. In this structure, an auxiliary gate electrode 21 capacitively coupled to, the p-type silicon layer 12 (the channel body) is provided corresponding to the gate electrode 14. In this example, the auxiliary gate 21 is embedded in the insulating film 11 to face a bottom face of the p-type silicon layer 12 with a gate insulating film 20 therebetween.

Figure 7:
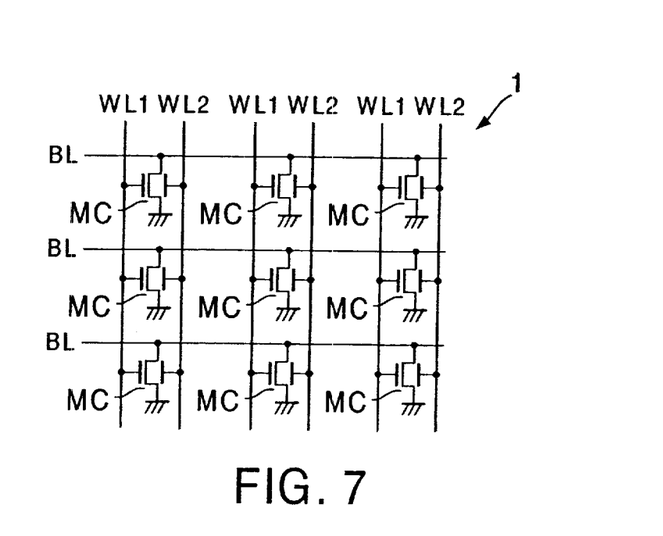
FIG. 7 is a diagram showing a structure of a cell array of the DRAM cells of the embodiment in FIG. 6.

The cell array 1 using such a cell structure is shown in FIG. 7. The auxiliary gates 21 are connected to auxiliary word lines WL2 parallel to word lines WL1 to which the main gate electrodes 14 are connected. In the cell array thus structured, the auxiliary word lines WL2 are driven in synchronization with the main word lines WL1 in a state in which the auxiliary word lines WL2 are offset to the lower voltage side relative to the main word lines WL1. By performing control of the channel body potential by capacitive coupling of the auxiliary word lines WL2 as described above, it becomes easier to secure a difference in the body potential between the "0" and "1" data.

Since the DRAM cell MC of this embodiment is of a current-read-type as described above, it is judged by comparing a cell current with a reference current for a data sense operation whether the amount of the cell current is large or small. As a source for the reference current, a dummy cell DMC is prepared as shown in FIG. 1. Although a dummy cell DMC of this kind is generally designed through which the reference current at an intermediate value between a cell current Icell1 when the DRAM cell is the "1" data and a cell current Icell0 when the DRAM cell is the "0" data is passed, the dummy cell DMC of this embodiment is composed of two MISFETs having the same structure as that of the DRAM cell MC and whose drains are connected in parallel to a dummy bit line DBL provided for every plural bit lines.

The "0" data is written in one MISFET-MC0 and the "1" data is written in the other MISFET-MC1. Gates of these MISFETs-MC0 and MC1 are connected to dummy word lines DWL1 and DWL2 respectively. The dummy word lines DWL1 and DWL2 are selectively driven simultaneously with a selected word line WL at the time of a data sense operation. Accordingly, a reference current Iref passed through the dummy bit line DBL is derived from Iref= Icell0+Icell1. Correspondingly, in data sense circuits 3, a cell current 2×Icell, which is double a detected cell current Icell, is generated to be compared with the aforesaid reference current Iref, as will be explained in detail later.

As shown in FIG. 1, the data sense circuits 3 are connected to the bit lines BL of the cell array 1 via bit line selecting circuits 2a. The bit line selecting circuits 2a are multiplexers each of which selects one line out of a plurality of the bit lines. In the example of FIG. 1, each of the bit line selecting circuits 2a selects one line out of four bit lines BL0 to BL3 in response to selecting signals BSL0 to BSL3. The plurality of data sense circuits 3 share a reference voltage generating circuit 6 connected to the dummy bit line DBL which is provided for every plural bit line. The reference voltage generating circuit 6 generates in a reference node RSN a reference voltage corresponding to the aforesaid reference current Iref which is passed through the dummy bit line DBL and the dummy bit line selecting circuit 2b. Each of first sense amplifiers 4a generates the aforeseaid double cell current 2×Icell, compare it with the reference current Iref, and generates in sense nodes SN a potential according to the data. Then, second sense amplifiers 4b, each of which detects the difference in the potential between the sense nodes SN and the reference node RSN, are provided.

In addition, between the sense amplifiers 4a and data lines DL (which are connected to the bit lines BL via the bit line selecting circuits 2a) and between the reference voltage generating circuit 6 and a reference data line RDL (which is connected to the dummy bit line DBL via a dummy bit line selecting circuit 2b by controlling a signal DBSL), clamping circuits 5 are provided for suppressing the rise in the voltages of the bit lines BL and the dummy bit line DBL respectively at the time of the data sense operation. The clamping circuits 5 prevent erroneous writing in the DRAM cell MC and the dummy cell DMC at the time of the data read operation, and more specifically, the clamping circuits 5 suppress the voltages of the bit lines BL and the dummy bit line DBL at a low level so that the selected memory cell and the dummy cell perform a triode operation at the time of the data sense operation.

Figure 2A:
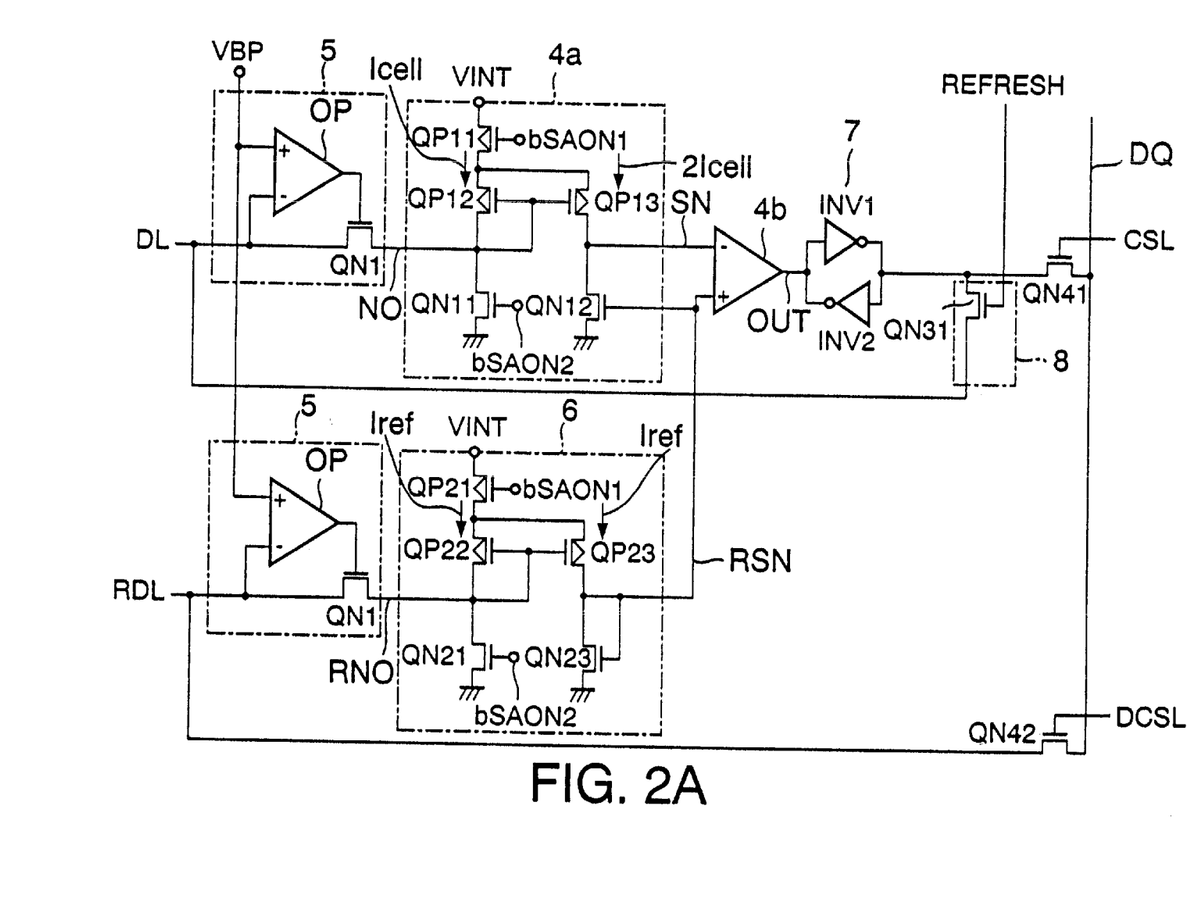
FIG. 2A is a diagram specifically showing a constitution of a main portion in FIG. 1.

FIG. 2A shows the specific configuration of the data sense circuits 3 concerning only one system. The clamping circuits 5 are structured to have n-channel MISFETs-QN1 inserted between an input terminal NO of the first sense amplifier 4a and the data line DL and between an input terminal RNO of the reference voltage generating circuit 6 and the reference data line RDL respectively, and operational amplifiers OP giving negative feedback control to gates of the n-channel MISFETs-QN1 according to the voltages of the data line DL and the reference data line RDL respectively.

Thus, while the voltages of the data line DL and the reference data line RDL are at a low level, the n-channel MISFETs-QN1 are in ON state and the short circuits exist between the input terminal NO of the first sense amplifier 4a and the data line DL and between the input terminal RNO of the reference voltage generating circuit 6 and the reference data line RDL. A positive bias voltage VBP is applied to non-inverting input terminals of the operational amplifiers OP. Therefore, when the voltage of the data line DL or the reference data line RDL excesses the VBP, the output of the corresponding operational amplifier OP is turned to an "L" level and the corresponding n-channel MISFET-QN1 is in OFF state so that the further rise in the voltage can be suppressed.

In the DRAM cell, at the time of a data write operation, a high level voltage (power-supply voltage Vdd, for example) is applied to the selected word line WL and the high level voltage (power-supply voltage Vdd, for example) is also applied to the selected bit line BL so as to perform the pentode operation, as described above. At the time of the data read operation, if the power-supply voltage Vdd is similarly applied to the selected word line WL and the potential of the selected bit line BL rises to the Vdd without a current being passed through the selected cell, the conditions become the same as those in a write mode. Therefore, the VBP is set at a lower level than the power-supply voltage Vdd. For example, the power-supply voltage Vdd is set at 2 V to 3 V and the VBP is set at approximately VBP=200 mV. As thus set, at the time of the data sense operation, the DRAM cell MC and the dummy cell DMC do not perform the pentode operation and the conditions of the "1" write can be prevented from being satisfied.

The reference voltage generating circuit 6 includes p-channel MISFETs-QP22 and QP23 constituting a current mirror circuit, whose sources are jointly connected to a high level voltage terminal VINT via a p-channel MISFET-QP21 for activation. A drain and a gate of the MISFET-QP22, which is a current source load for the dummy bit line DBL, are jointly connected to the input terminal RNO and a drain of the MISFET-QP23 is connected to the reference node RSN. Between the reference node RSN and a ground terminal, a diode-connected n-channel MISFET-QN23 is provided. Between the input terminal RNO and a ground terminal, an n-channel MISFET-QN21 for precharge is provided.

The first sense amplifier 4a includes p-channel MISFETs-QP12 and QP13 constituting a current mirror circuit, whose sources are jointly connected to a high level voltage terminal VINT via a p-channel MISFET-QP11 for activation. A drain and a gate of the MISFET-QP12, which is a current source load of the bit line BL, are jointly connected to the input terminal NO and a drain of the MISFET-QP13 is connected to the sense node SN. Between the sense node SN and a ground terminal, an n-channel MISFET-QN12 whose gate is controlled by the reference node RSN is provided. Between the input terminal NO and a ground terminal, an n-channel MISFET-QN11 for precharge is provided.

In the reference voltage generating circuit 6, the MISFETs-QP22 and QP23 constituting the current mirror are defined to have the same size. That is, a channel width W of the MISFET-QP22 and a channel width W of the MISFET-QP23 are the same, and a channel length L of the MISFET-QP22 and a channel length L of the MISFET-QP23 are the same. Thereby, at the time of the data sense operation, when a cell current which is sent to the dummy cell DMC by the current source MISFET-QP22 is Iref, the reference current Iref, which is the same amount of the cell current Iref, is also sent to the MISFET-QP23 for output. A reference voltage determined according to the reference current Iref is obtained in the reference node RSN.

On the other hand, in the MISFETs-QP12 and QP13 constituting the current mirror in the first sense amplifier 4a, different from the reference voltage generating circuit 6, a ratio W/L of (a channel width W)/(a channel length L) of the QP13 is set as double the ratio W/L of the QP12. Thereby, at the time of the data sense operation, when a cell current which is sent to the memory cell MC by the current source MISFET-QP12 is Icell, the output current, which is 2×Icell, is sent to the MISFET-QP13 for output.

The MISFET-QN23 of the reference voltage generating circuit 6 and the MISFET-QN12 of the sense amplifier 4a also constitute a current mirror, and then these are set at the same size in this embodiment. That is, a channel width W of the MISFET-QN23 and a channel width W of the MISFET-QN12 are the same, and a channel length L of the MISFET-QN23 and a channel length L of the MISFET-QN12 are the same. Thereby, the currents 2×Icell and the reference current Iref come into collision so that a voltage determined according to the amount of the currents 2×Icell and the reference current Iref can be obtained in the sense node SN.

As described above, when the cell current of the "0" data is defined as Icell0 and the cell current of the "1" data is defined as Icell1, the reference current Iref passed through the dummy bit line DBL is derived from the following Formula 1.

$$Iref = Icell0 + Icell1 \qquad \text{(Formula 1)}$$

As described above, since the "0" data cell has a high threshold voltage, a large current is not passed through it. Meanwhile, since the "1" data cell has a low threshold voltage, a large current is passed through it. That is, the relation between the Icell0 and the Icell1 is Icell0<Icell1. Since the output current of the sense amplifier 4a is 2×Icell, the relation between the reference current Iref and the output current is derived from the following Formula 2 depending on whether the selected cell is the "0" or "1" data.

In the case of data "0", $2 \times Icell = 2 \times Icell0 < Iref$

In the case of data "1", $2 \times Icell = 2 \times Icell1 > Iref$   (Formula 2)

When 2×Icell is smaller than Iref, a power for turning on the MISFET-QN12 so as to pass the current Iref through it is stronger than that for turning on the MISFET-QP13 so as to pass the current 2×Icell through it. As a result, the potential of the sense node SN is inclined toward the ground side and dropped.

On the other hand, when 2×Icell is larger than Iref, a power for turning on the MISFET-QP13 so as to pass the current 2×Icell through it is stronger than that for turning on the MISFET-QN12 so as to pass the current Iref through it. As a result, the voltage of the sense node SN is inclined toward the high level voltage terminal VINT side and raised.

As be understood from this, the polarity of the potential difference between the sense node SN and the reference node RSN varies depending on the data. The voltage difference is detected by the second sense amplifier 4b. In the example in FIG. 2A, the second sense amplifier 4b is a comparator which outputs a sense output OUT of "L" or "H" according to "H" or "L" of the sense node SN relative to the reference node RSN.

Incidentally, in order to satisfy the aforesaid relation between the output current of the sense amplifier 4a and the output current of the reference voltage generating circuit 6, it is more generally recommended that the size of the MISFET-QP23 of the reference voltage generating circuit 6 is set so that a current P times as large as that passed through the MISFET-QP22 (P is any positive number) is passed through the MISFET-QP23 while, in the sense amplifier 4a, the size of the MISFET-QP13 is set so that a current Q times as large as that passed through the MISFET-QP12 (Q/P is 2) is passed through the MISFET-QP13.

In this embodiment, a data holding circuit 7 capturing sense data in response to a predetermined timing signal and holding it therein is provided in the output OUT of the second sense amplifier 4b. In this embodiment, the data holding circuit includes inverters INV1 and INV2. An output of the inverter INV1 is inputted to the inverter INV2, and an output of the inverter INV2 is inputted to the inverter INV1. Therefore, the output of the inverter INV1 is an output of the data holding circuit 7. The data held in the data holding circuit 7 is transmitted to a data line DQ via a column gate MISFET-QN41 which is driven by a column selecting line CSL.

In the output of the data holding circuit 7, a refresh circuit 8 for refreshing memory cell data at a predetermined refresh cycle based on the held data is provided. The refresh circuit 8 includes an n-channel MISFET-QN31 controlled by a refresh control signal REFRESH to feed the data held in the data holding circuit 7 back to the data line DL. Specifically, at the time of the "0" and "1" data read operation, the data holding circuit 7 is in "L" and "H" output states respectively, and the output states are transmitted to the bit line BL via the MISFET-QN31 and via the data line DL. When the "L" and "H" output states of the data holding circuit 7 are set at a bit line "L" level voltage VBLL at the time of the "0" write operation and a bit line "H" level voltage VBLH at the time of the "1" write operation respectively and transmitted as they are, the data is refreshed in the selected DRAM cell.

The dummy cell DMC includes two MISFETs and it is required to write the "0" and "1" data in them at predetermined intervals. For this reason, an MISFET-QN42 constituting a write circuit for writing the "0" and "1" data in the MISFETs-MC0 and MC1 of the dummy cells via the data line DQ is provided between the data line DQ and the reference data line RDL.

Although the sense amplifiers and the reference voltage generating circuit of only one system are shown in FIG. 2A, there are actually provided plural systems of sense amplifiers which share the reference voltage generating circuit 6 as shown in FIG. 1. In this case, the refresh circuit 8 is necessary for each system of the sense amplifiers.

Figure 2B:
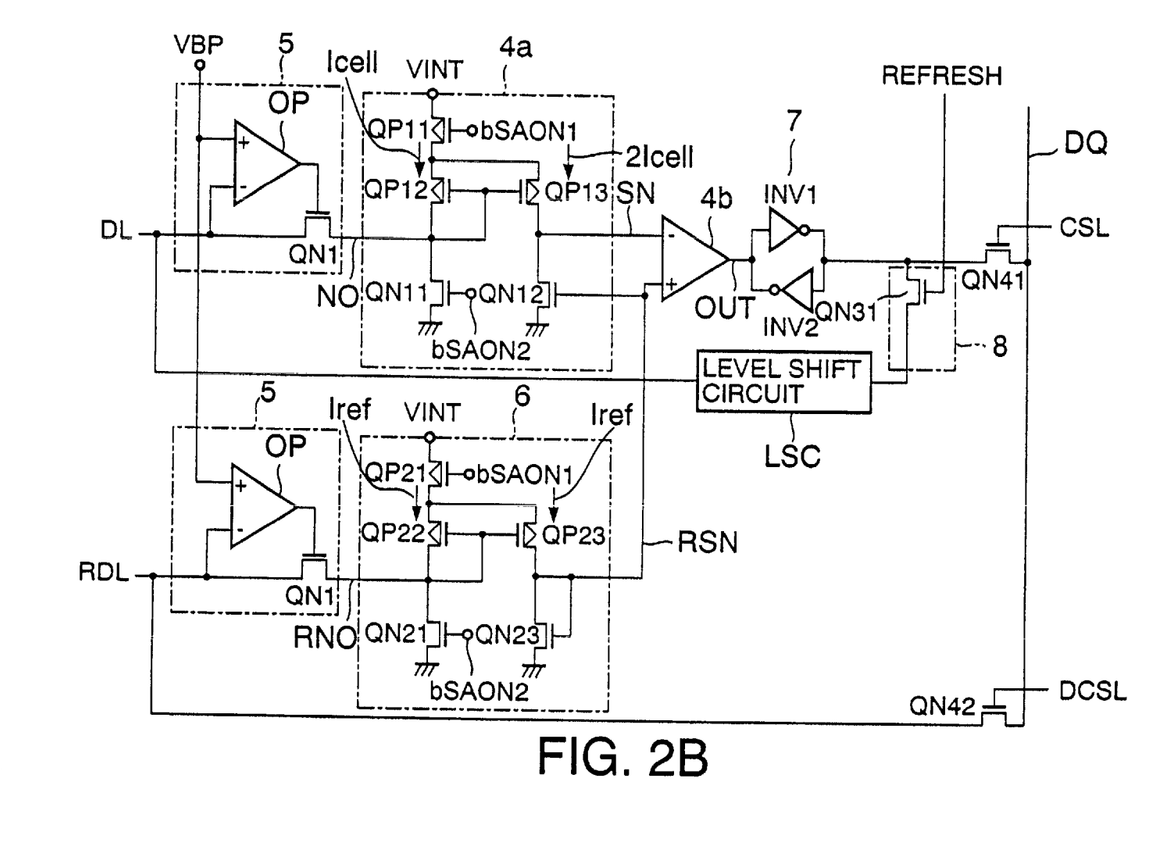
FIG. 2B is a diagram showing a modified constitution of the main portion shown in FIG. 2A.

In addition, as shown in FIG. 2B, an appropriate level shift circuit LSC may be provided in a path of the refresh circuit 8 in order that a voltage of the bit line BL at the refresh operation is different from a voltage of the data holding circuit 7 holding the read data. For example, when the data holding circuit 7 holds the data "1", the level shift circuit LSC is supplied with the voltage of the data holding circuit 7 through the MISFET-QN31 and may shift it to a higher voltage so as to supply it to the data line DL. On the other hand, when the data holding circuit 7 holds the data "0", the level shift circuit LSC is supplied with the potential of the data holding circuit 7 through the MISFET-QN31 and may shift it to a lower voltage so as to supply it to the data line DL.

Figure 3A:
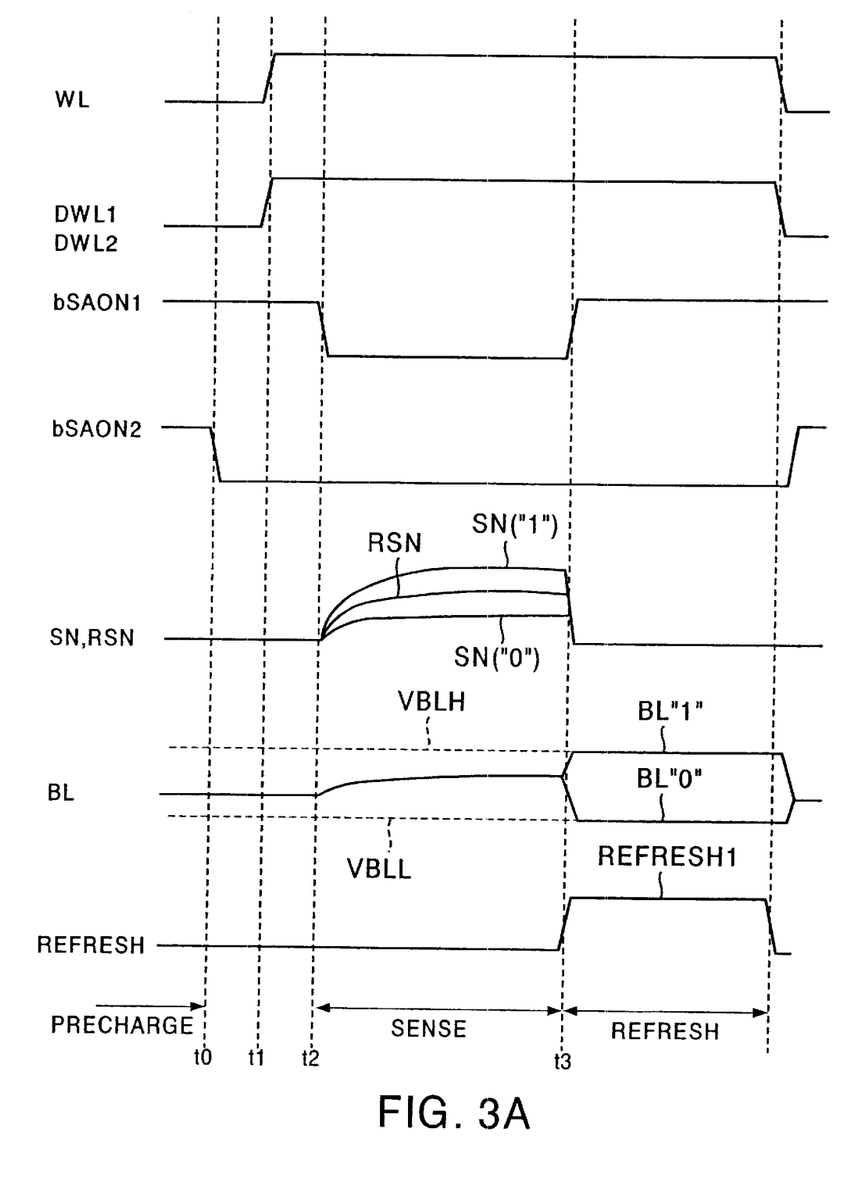
FIG. 3A is a timing chart explaining an operation of the data sense circuits in FIG. 1.

A data sense operation according to this embodiment will be specifically explained with reference to the timing chart in FIG. 3A. Before the data sense operation, until a point in time t0, a precharge signal bSAON2 is at "H" and the bit line BL and the dummy bit line DBL are precharged at an "L" level (ground potential) via the data line DL and the reference data line RDL, respectively. The precharge operation is stopped at the point in time t0, and the selected word line WL and the dummy word lines DWL1 and DWL2 are raised to an "H" level at a point in time t1. When a sense amplifier activation signal bSAON1 is turned to "L" at a point in time t2, the first sense amplifier 4a and the reference voltage generating circuit 6 are activated so that the cell current Icel is passed through the selected bit line BL and the dummy cell current (reference current Iref) is passed through the dummy bit line DBL according to the cell data.

A large current is not passed through the cell of the "0" data which has a high threshold, while a large current is passed through the cell of the "1" data. Meanwhile, a current larger than the current Icell1 of the cell of the "1" data is passed through the dummy cell DMC because the dummy cell DMC is composed of the "0" and "1" data cells connected in parallel. The voltage level of the bit line BL and the dummy bit line DBL are clamped by the clamping circuits 5 at a predetermined value regardless of the cell current capacity.

Based on the cell current relation described above, in the first sense amplifier 4a, a potential lower than that of the reference node RSN in the case of the "0" data and higher than that of the reference node RSN in the case of the "1" data is obtained in the sense node SN by comparison of the cell current 2×Icel with the reference current Iref. Then, the second sense amplifier 4b judges the potential difference between the sense node SN and the reference node RSN so as to obtain the sense output OUT which is "L" in the case of the "0" data and "H" in the case of the "1" data.

At a point in time t3, the sense amplifier 4a and the reference voltage generating circuit 6 are inactivated and then the data held in the data holding circuit 7 can be taken out by a column selection. FIG. 3A does not show this operation but shows an example subsequently proceeding into the refresh cycle. In the refresh cycle, the word line WL which is at "H" at the time of the read operation maintains the "H" and the refresh control signal REFRESH is set at the "H".

On this occasion, if the low level voltage VBLL and the high level voltage VBLH which are given to the bit line BL depending on the read data "0" and "1" are set as potentials required for the "0" and "1" write operation respectively, the read data is written again in the selected cell MC and it is refreshed.

This refresh operation is for the DRAM cells MC, however, in this embodiment, a refresh operation for the dummy cell DMC is performed before the refresh operation for the DRAM cell MC is started or after the refresh operation for all the DRAM cells MC is ended. In other words, the refresh operation is performed every a predetermined period in this embodiment.

Figure 3B:
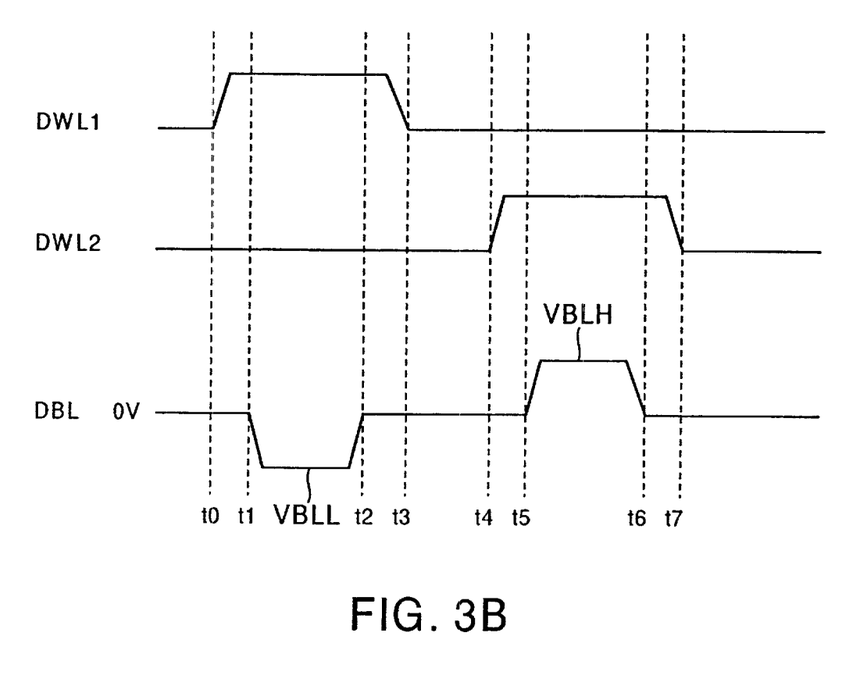
FIG. 3B is a timing chart explaining a refresh operation for a dummy cell.

FIG. 3B is a timing chart for explaining the refresh operation for the dummy cell DMC. As shown in FIG. 3B, the dummy word line DWL1 is raised to the "H" level at a point in time t0, and then the dummy bit line DBL is dropped to the low level voltage VBLL at a point in time t1 slightly after the point in time 0. The low level voltage VBLL is transmitted through the MISFET-QN42 driven by the dummy column selecting line DCSL and through the reference data line RDL from the data line DQ. As a result, the "0" is written in the MISFET-MC0 of the dummy cell DMC and the MISFET-MC0 is refreshed. After this, the dummy bit line DBL returns from the low level voltage VBLL to 0V at a point in time 2, and then the dummy word line DWL1 returns from the "H" level to the "L" level at a point in time 3.

Subsequently, the dummy word line DWL2 is raised to the "H" level at a point in time t4, and then the dummy bit line DBL is raised to the high level voltage VBLH at a point in time t5 slightly after the point in time 4. The high level voltage VBLH is transmitted through the MISFET-QN42 driven by the dummy column selecting line DCSL and through the reference data line RDL from the data line DQ. As a result, the "1" is written in the MISFET-MC1 of the dummy cell DMC and the MISFET-MC1 is refreshed. After this, the dummy bit line DBL returns from the high level voltage VBLH to 0V at a point in time 6, and then the dummy word line DWL2 returns from the "H" level to the "L" level at a point in time 7.

By this refresh operation, a state in which the two MISFETs hold the "0" and "1" therein is written again in the dummy cell DMC. Moreover, a refresh control circuit generates the refresh control signal REFRESH and drives the dummy word lines DWL1 and DWL2, the data line DQ and the dummy column selecting line DCSL.

As described above, according to this embodiment, using a DRAM cell which is structured by one simple transistor having a floating channel body, a DRAM with the channel body as a storage node can be obtained. A data sense circuit is made to judge data by preparing the dummy cell DMC, which is a reference current source, and comparing a cell current with a current of the dummy cell DMC. Particularly in this embodiment, a cell in which "0" data is written and a cell in which "1" data is written are provided in parallel as the dummy cell DMC so as to compare the amount of a current 2×Icel, which is double a cell current Icel, with reference to a reference current Iref determined by the dummy cell DMC. This ensures data judgment even in a case of a DRAM cell whose cell current difference between the "0" and "1" data is small.

Further, by providing clamping circuits 5 which suppress the rise in voltages of the bit line BL and the dummy bit line DBL at a time of a data sense operation, the selected cell MC and the dummy cell DMC do not satisfy the conditions of "1" write so that erroneous writing can be prevented in a read operation. Moreover, in a nonvolatile semiconductor memory such as an EEPROM using a current-read-type memory cell, a method of, for example, precharging the bit line at a power-supply voltage Vdd is used, but if the same precharging method is used for the DRAM cell of this embodiment, a pentode operation is performed when a word line is raised and erroneous writing is caused. With respect to this, in this embodiment, it is set to perform detection of the cell current with the bit line precharge being set at a ground potential so that the erroneous writing can be prevented.

Figure 9:
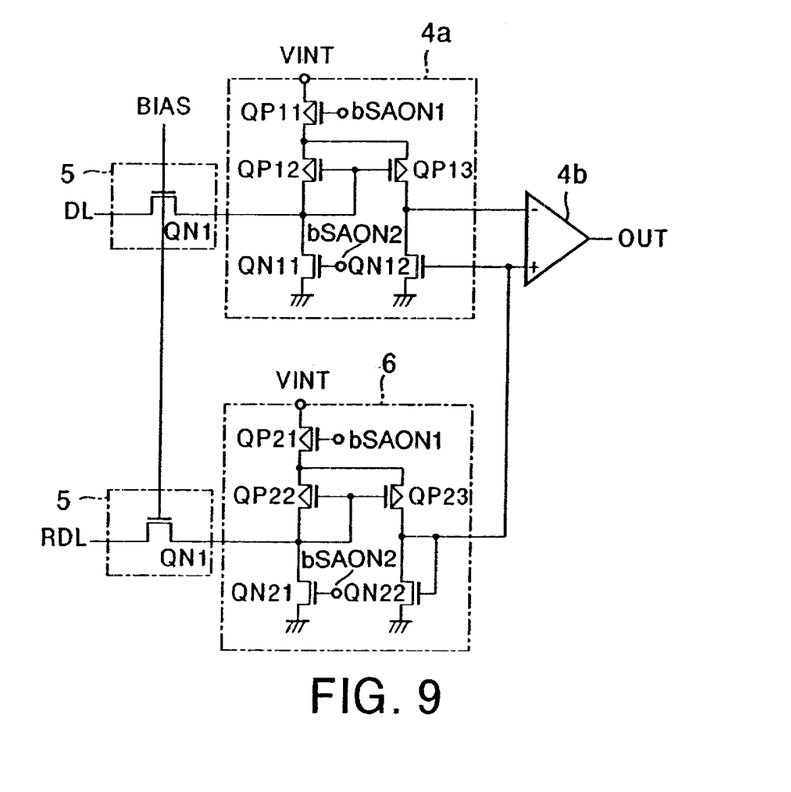
FIG. 9 is a diagram showing a constitution of a main portion of a DRAM according to another embodiment.

FIG. 9 shows the constitution of a main portion of a data sense circuit of another embodiment corresponding to FIG. 2A. In this embodiment, a fixed bias voltage BIAS is applied to the gates of the n-channel MISFETs-QN1 of the clamping circuits 5. In the clamping method, the rise in the voltages of the bit line and the dummy bit line can be suppressed to BIAS−Vth (Vth: a threshold voltage of the QN1). Therefore, by selecting the bias voltage BIAS, the erroneous writing can be securely prevented.

The present invention is not limited to the above-described embodiments. For example, although the dummy cell is composed of one set of cell transistors in which the "0" and "1" data are respectively written in the embodiments, it may be composed of plural sets of cell transistors. Thereby, a reference current obtained by averaging variation in the cell currents of the "0" and "1" data can be generated, which enables more reliable data judgment.

In general, when a dummy cell is composed of N pairs of cell transistors provided in parallel, the reference current is derived from Iref=N (Icell0+Icell1), where N is the natural number. On this occasion, as in the aforesaid embodiments, if the reference voltage generating circuit 6 is defined to generate one-to-one output currents by a current mirror, a current mirror in the first sense amplifier 4a maybe designed to generate currents at a ratio of one-to-2N.

When a dummy cell is composed of N pairs of cell transistors, it is more generally recommended that the size of the MISFET-QP23 of the reference voltage generating circuit 6 is set so that a current P times as large as that passed through the MISFET-QP22 (P is any positive number) is passed through the MISFET-QP23 while, in the sense amplifier 4a, the size of the MISFET-QP13 is set so that a current Q times as large as that passed through the MISFET-QP12 (Q/P is 2N) is passed through the MISFET-QP13.

Moreover, in the aforementioned embodiments, a DRAM in which a DRAM cell is composed of one MISFET having a floating channel body as a storage node is explained, but the data sense circuit of the embodiments is also applicable to semiconductor memories using other current-read-type memory cells of various kinds.

What is claimed is:

1. A semiconductor memory device comprising:
   a memory cell array which includes memory cells for holding data;
   a reference current generating circuit which generates a reference current;
   a reference voltage generating circuit which generates a reference voltage in a reference node based on the reference current generated by the reference current generating circuit;
   a first sense circuit which generates an output current on the basis of a cell current of the selected memory cell and which generates a data potential in a sense node on the basis of the output current and the reference current; and a second sense circuit which detects data held in the selected memory cell by comparing the data potential in the sense node with the reference voltage in the reference node.

2. The semiconductor memory device according to claim 1, wherein the memory cells are MISFETs, each of which includes a channel body in a floating state and each of which has a first data state in which the channel body is set in a first potential and a second data state in which the channel body is set in a second potential.

3. The semiconductor memory device according to claim 2, wherein the reference current generating circuit includes a plurality of MISFETs and a structure of each of the MISFETs of the reference current generating circuit is the same as that of the MISFET of the memory cell.

4. The semiconductor memory device according to claim 2, wherein the reference current generating circuit comprises:

first MISFET which is set in the first data state, the number of the first MISFET is N, where N is a natural number; and second MISFET which is set in the second data state, the number of the second MISFETs is also N, and wherein a structure of each of the first MISFET and the second MISFET is the same as that of the MISFET of the memory cell.

5. The semiconductor memory device according to claim 4, further comprising a setting circuit which sets the first MISFET in the first data state and the second MISFET in the second state every a predetermined period.

6. The semiconductor memory device according to claim 1, wherein the memory cells are MISFETs, each of which includes a channel body in a floating state, and wherein a drain of the memory cell is connected to a bit line and a gate of the memory cell is connected to a word line, and the memory cell has a first data state in which the channel body is set in a first potential and a second data state in which the channel body is set in a second potential.

7. The semiconductor memory device according to claim 6, wherein the first data state is set by the impact ionization generated near a drain junction with a pentode operation of the memory cell, and the second data state is set by passing a forward bias current between the channel body and the drain of the memory cell to emit majority carriers in the channel body.

8. The semiconductor memory device according to claim 7, wherein the reference current generating circuit comprises a plurality of MISFETs and a structure of each of the MISFETs of the reference current generating circuit is the same as that of the MISFET of the memory cell.

9. The semiconductor memory device according to claim 8, wherein the reference current generating circuit comprises:

first MISFET which is set in the first data state, the number of the first MISFET is N, where N is a natural number; and second MISFET which is set in the second data state, the number of the second MISFET is also N.

10. The semiconductor memory device according to claim 9, wherein a gate of the first MISFET is connected to a first dummy word line and a drain of the first MISFET is connected to a dummy bit line, and a gate of the second MISFET is connected to a second dummy word line and a drain of the second MISFET is connected to the dummy bit line.

11. The semiconductor memory device according to claim 10, wherein the reference voltage generating circuit comprises:

a first p-channel MISFET which is a current source load for the dummy bit line;

a second p-channel MISFET which constitutes a current mirror circuit with the first p-channel MISFET, a drain of the second p-channel MISFET being connected to the reference node; and a first n-channel MISFET, a gate and a drain of which are commonly connected to the reference node and a source of which is connected to a first reference voltage.

12. The semiconductor memory device according to claim 11, wherein a size of the second p-channel MISFET is set so that a current P times as large as that passed through the first p-channel MISFET is passed through the second p-channel MISFET, where P is any positive number.

13. The semiconductor memory device according to claim 12, wherein the first sense circuit comprises:

a third p-channel MISFET which is a current source load for the bit line;

a fourth p-channel MISFET which constitutes a current mirror circuit with the third p-channel MISFET, a drain of the fourth p-channel MISFET being connected to the sense node; and a second n-channel MISFET, a drain of which is connected to the sense node, a source of which is connected to the first reference voltage and a gate of which is connected to the reference node.

14. The semiconductor memory device according to claim 13, wherein a size of the fourth p-channel MISFET is set so that a current Q times as large as that passed through the third p-channel MISFET is passed through the fourth p-channel MISFET, where Q/P is 2N, and a size of the second n-channel MISFET is the same as that of the first n-channel MISFET.

15. The semiconductor memory device according to claim 14, wherein the reference voltage generating circuit further comprises a first precharge MISFET which sets the dummy bit line at a second reference voltage before its data sense operation, and the first sense circuit further comprising a second precharge MISFET which sets the bit line at the second reference voltage before its data sense operation.

16. The semiconductor memory device according to claim 14, further comprising:

a first clamping circuit which is located between the first sense circuit and the bit line and which suppresses a rise in a voltage of the bit line; and a second clamping circuit which is located between the reference voltage generating circuit and the dummy bit line and which suppresses a rise in a voltage of the dummy bit line.

17. The semiconductor memory device according to claim 16, wherein the first clamping circuit comprises a third n-channel MISFET which is controlled by a negative feedback of the voltage of the bit line, and the second clamping circuit comprises a fourth n-channel MISFET which is controlled by a negative feedback of the voltage of the dummy bit line.

18. The semiconductor memory device according to claim 16, wherein the first clamping circuit comprises a fifth n-channel MISFET, a fixed bias voltage being applied to a gate of the fifth n-channel MISFET; and the second clamping circuit comprises a sixth n-channel MISFET, the fixed bias voltage being applied to a gate of the sixth n-channel MISFET.

19. The semiconductor memory device according to claim 14, further comprising a data holding circuit which is located at an output of the second sense circuit and which holds the data detected by the second sense circuit.

20. The semiconductor memory device according to claim 14, further comprising a setting circuit which sets the first MISFET in the first data state and the second MISFET in the second state every a predetermined period.

21. The semiconductor memory device according to claim 1, wherein the reference current generating circuit and the reference voltage generating circuit are shared among a plurality of the first sense circuit and the second sense circuit.

22. The semiconductor memory device according to claim 1, further comprising a bit line selecting circuit which connects the first sense circuit to a selected one of the bit lines.

* * * * *

UNITED STATES PATENT AND TRADEMARK OFFICE
CERTIFICATE OF CORRECTION

PATENT NO. : 6,567,330 B2
DATED : May 20, 2003
INVENTOR(S) : Katsuyuki Fujita et al.

It is certified that error appears in the above-identified patent and that said Letters Patent is hereby corrected as shown below:

<u>Column 11,</u>
Lines 23 and 62, in between "a" and "natural" -- positive -- has been inserted.

Signed and Sealed this

Eighteenth Day of November, 2003

JAMES E. ROGAN
*Director of the United States Patent and Trademark Office*